US008058852B2

(12) United States Patent
Kang et al.

(10) Patent No.: US 8,058,852 B2
(45) Date of Patent: Nov. 15, 2011

(54) DEVICE AND METHOD FOR DETECTING ZERO CROSSING AND VOLTAGE AMPLITUDE FROM SINGLE PULSE SIGNAL (75) Inventors: Tae Kyung Kang, Guro-gu (KR); Man Ho Byean, Suwon (KR); Ju Hyun Baek, Yeongdeungpo-gu (KR)

(73) Assignee: Woongjin Coway Co., Ltd., Gongju, Choongcheongnam-do (KR)

( * ) Notice: Subject to any disclaimer, the term of this patent is extended or adjusted under 35 U.S.C. 154(b) by 300 days.

(21) Appl. No.: 12/428,420

(22) Filed: Apr. 22, 2009

(65) Prior Publication Data
US 2009/0267575 A1 Oct. 29, 2009

(30) Foreign Application Priority Data

Apr. 23, 2008 (KR) .................. 10-2008-0037754
Mar. 31, 2009 (KR) .................. 10-2009-0027582

(51) Int. Cl.
G05F 1/10 (2006.01)
(52) U.S. Cl. ....................................... 323/235
(58) Field of Classification Search .............. 323/234, 323/235, 318, 319; 363/21.03
See application file for complete search history.

(56) References Cited

U.S. PATENT DOCUMENTS

| 4,156,280 A | 5/1979 | Griess | |
| 4,598,195 A | 7/1986 | Matsuo | |
| 4,663,569 A * | 5/1987 | Alley et al. | 315/175 |
| 4,838,080 A * | 6/1989 | Okano | 73/114.47 |
| 5,077,486 A * | 12/1991 | Marson et al. | 205/728 |
| 5,216,352 A * | 6/1993 | Studtmann et al. | 323/241 |
| 5,239,255 A * | 8/1993 | Schanin et al. | 323/237 |

FOREIGN PATENT DOCUMENTS

| JP | 61-110174 | 7/1986 |
| JP | 07-030392 | 1/1995 |
| JP | 10-177044 | 6/1998 |

* cited by examiner

Primary Examiner — Adolf Berhane
(74) Attorney, Agent, or Firm — McDermott Will & Emery LLP (57) ABSTRACT

A device and method for detecting a zero crossing and voltage amplitude of a commercial power source voltage inputted to an electronic device, from a single pulse signal are disclosed. The apparatus for detecting a zero crossing and a voltage amplitude from a single pulse signal includes: a first calculation unit that compares the commercial power source voltage to a first reference voltage to determine whether or not the commercial power source voltage is smaller than the first reference voltage; a second calculation unit that compares the commercial power source voltage to a second reference voltage smaller than the first reference voltage to determine whether or not the commercial power source voltage is larger than the second reference voltage; a pulse output unit that outputs a pulse if the commercial power source voltage is smaller than the first reference voltage but larger than the second reference voltage; and a detecting unit that detects a zero crossing and a voltage amplitude by analyzing the pulse which has been outputted from the pulse output unit.

7 Claims, 6 Drawing Sheets

DEVICE AND METHOD FOR DETECTING ZERO CROSSING AND VOLTAGE AMPLITUDE FROM SINGLE PULSE SIGNAL

CROSS-REFERENCE TO RELATED APPLICATIONS

This application claims the priority of Korean Patent Application No. 2008-37754 filed on Apr. 23, 2008, and the priority of Korean Patent Application No. 2009-27582 filed on Mar. 31, 2009 in the Korean Intellectual Property Office, the disclosure of which is incorporated herein by reference.

BACKGROUND OF THE INVENTION

1. Field of the Invention

The present invention relates to a device and method for detecting a zero crossing and a voltage amplitude from a single pulse signal and, more particularly, to a device and method for detecting a zero crossing and a voltage amplitude of a commercial power source voltage inputted to an electronic device, from a single pulse signal.

2. Description of the Related Art

In the related art, individual circuits are provided to separately detect a zero crossing and a voltage amplitude. For example, a device for detecting a zero crossing and a voltage amplitude of a commercial power source voltage inputted to a product including an instantaneous water heating module such as a water purifier or a bidet will now be described with reference to FIG. 1.

Figure 1:
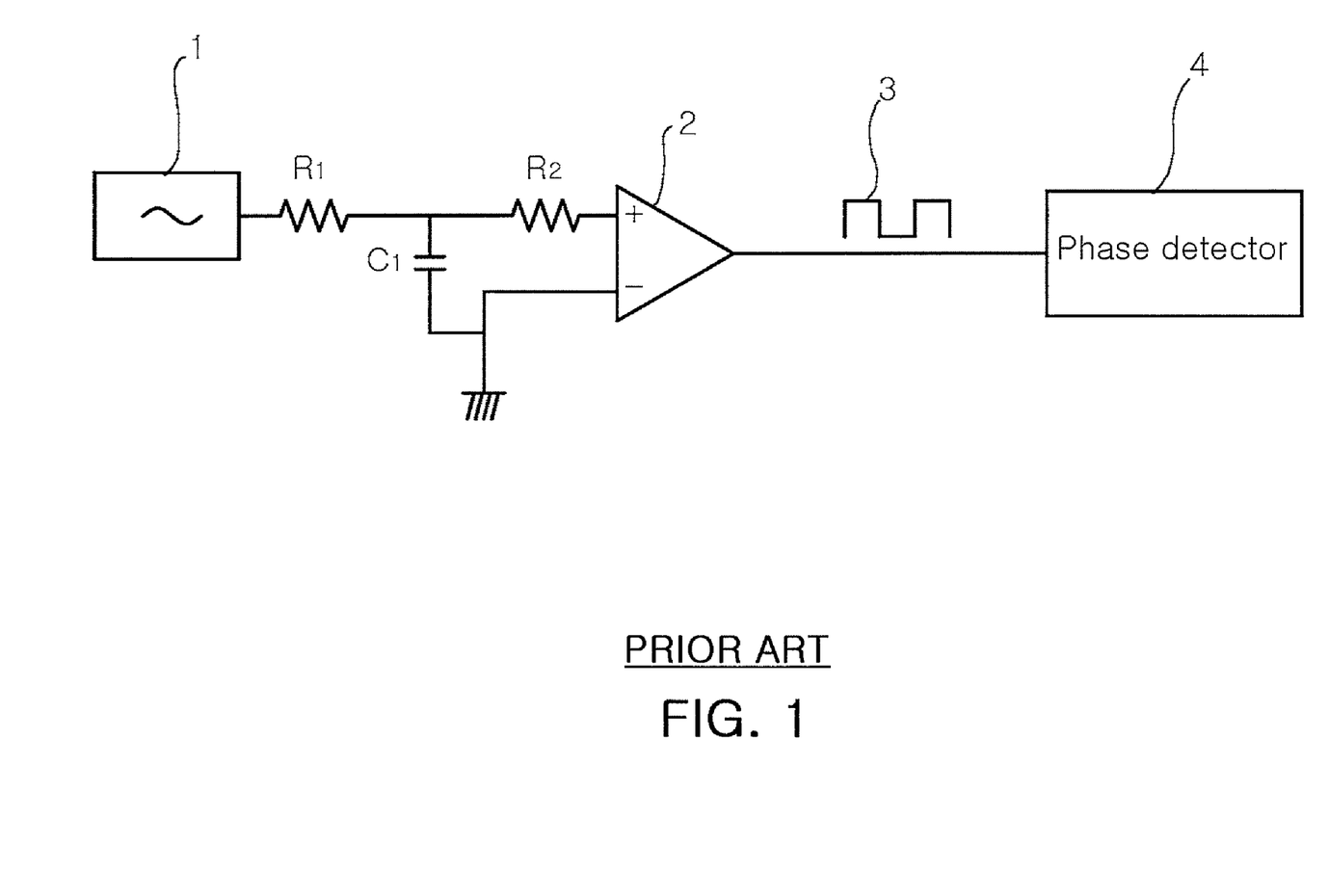
FIG. 1 illustrates the configuration of the related art zero crossing detector for detecting a zero crossing of a commercial power source voltage.

FIG. 1 illustrates the configuration of the related art zero crossing detector for detecting a zero crossing of a commercial power source voltage. As shown in FIG. 1, when a phase voltage 1 of the commercial power source voltage is inputted, a comparator 2 outputs a high level voltage if the phase voltage 1 is larger than 0, and outputs a low level voltage if the phase voltage 1 is smaller than 0, to thus output a square wave voltage 3. A phase detector 4 detects the phase of the square wave voltage 3 to detect a zero crossing.

Figure 2:
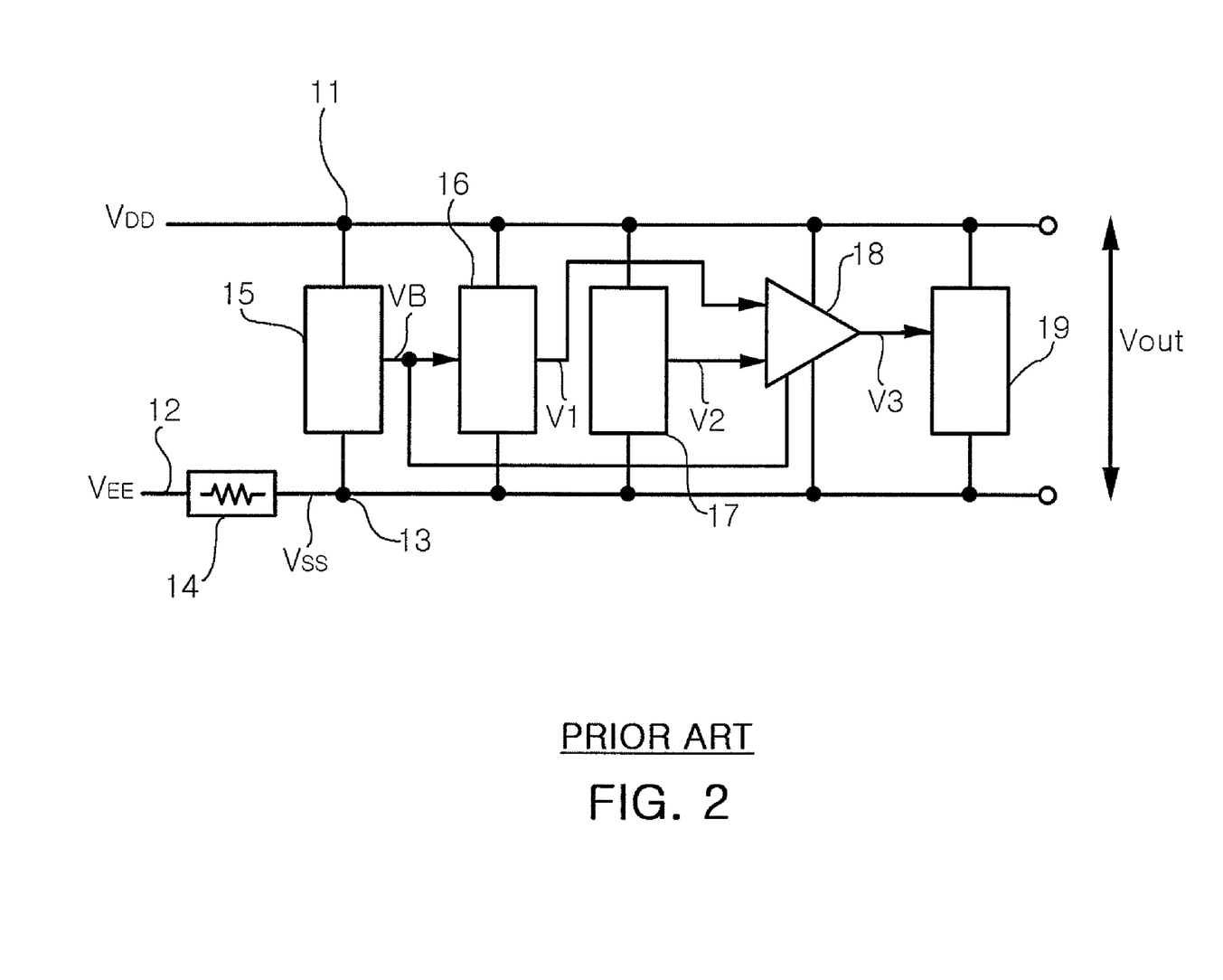
FIG. 2 is a circuit diagram of the related art circuit for detecting the commercial power source voltage.

FIG. 2 is a circuit diagram of the related art circuit for detecting the commercial power source voltage. As shown in FIG. 2, as an electric potential $V_{DD}$ of a high electric potential side is supplied to a connection point 11, likewise, an electric potential $V_{EE}$ of a low electric potential side is supplied to a connection point 12, a resistor 14 is connected between the connection point 12 and another connection point 13, and a bias voltage generating circuit 15, a reference voltage generating circuit 16, a voltage dividing circuit 17, a voltage comparator 18, and a current path circuit 19 are sequentially connected between the connection point 11 and the connection point 13.

The bias voltage generating circuit 15 generates a certain DC bias voltage $V_B$ from a potential difference between the potential $V_{DD}$ at the connection point 11 and the potential $V_{SS}$ at the connection point 13. The DC bias voltage $V_B$ is set as a value with which a MOS transistor, which has a gate to which the DC bias voltage $V_B$ is supplied, operates in a weak inversion region. The DC bias voltage $V_B$ generated by the bias voltage generating circuit 15 is supplied to both the reference voltage generating circuit 16 and the voltage comparator 18.

The voltage comparator 18 compares a supplied reference voltage $V_1$ and a divided voltage $V_2$, and outputs an output voltage $V_3$ according to the comparison result to the current path circuit 19. The current path circuit 19 supplies a current according to the output voltage $V_3$ from the comparator 18 to between the current connection points 12 and 13, to generate a voltage drop at the resistor 14 to thus make an output voltage $V_{OUT}$ adjusted uniformly.

In this manner, in the related art, the zero crossing detector and the voltage detection circuit are separately installed to detect the zero crossing and the voltage amplitude of the commercial power source voltage inputted to an electronic device. Thus, the number of parts used for the products increases, leading to an increase in the production unit cost, so not only do the product supply costs increase but also spending appetite of consumers who want low-cost products cannot be satisfied.

SUMMARY OF THE INVENTION

An aspect of the present invention provides a device and method for detecting a zero crossing and a voltage amplitude of a commercial power source voltage inputted to an electronic device from a single pulse signal.

According to an aspect of the present invention, there is provided an apparatus for detecting a zero crossing and a voltage amplitude of a commercial power source voltage inputted to an electronic device, including: a first calculation unit that compares the commercial power source voltage to a first reference voltage to determine whether or not the commercial power source voltage is smaller than the first reference voltage; a second calculation unit that compares the commercial power source voltage to a second reference voltage smaller than the first reference voltage to determine whether or not the commercial power source voltage is larger than the second reference voltage; a pulse output unit that outputs a pulse if the commercial power source voltage is smaller than the first reference voltage but larger than the second reference voltage; and a detecting unit that detects a zero crossing and a voltage amplitude by analyzing the pulse which has been outputted from the pulse output unit.

The detecting unit may include: an interrupt generating unit that generates an interrupt when the pulse which has been outputted by the pulse output unit dies; a time checking unit that checks a time duration from when the pulse which has been outputted by the pulse output unit dies to when the pulse output unit outputs a first different pulse afterward; a comparing unit that compares the time duration checked by the time checking unit to a pre-set reference time; and a discriminating unit that discriminates that there is a zero crossing within the time duration checked by the time checking unit if the time duration checked by the time checking unit is shorter than the pre-set reference time, or discriminates a voltage amplitude if the time duration checked by the time checking unit is longer than the pre-set reference time.

The discriminating unit may discriminate such that the zero crossing exists at a middle point of the time width checked by the time checking unit.

The discriminating unit may discriminate the input voltage amplitude by obtaining the time point at which the pulse which has been outputted by the pulse output unit dies and the time point at which the pulse output unit outputs the first different pulse afterward.

The pre-set reference time may correspond to a half period of a waveform obtained by performing full wave rectification on the commercial power source voltage.

According to another aspect of the present invention, there is provided a method for detecting a zero crossing and a voltage amplitude of a commercial power source voltage inputted to an electronic device, including: comparing the commercial power source voltage to a first reference voltage to determine whether or not the commercial power source voltage is smaller than the first reference voltage; comparing the commercial power source voltage to a second reference voltage smaller than the first reference voltage to determine whether or not the commercial power source voltage is larger than the second reference voltage; outputting a pulse if the commercial power source voltage is smaller than the first reference voltage but larger than the second reference voltage; and detecting a zero crossing and a voltage amplitude by analyzing the outputted pulse.

The detecting of a zero crossing and a voltage amplitude may include: generating an interrupt when the outputted pulse dies; checking a time duration from when the outputted pulse dies to when a first different pulse is outputted afterward; comparing the checked time duration to a pre-set reference time; and discriminating that there is a zero crossing within the checked time duration if the checked time duration is shorter than the pre-set reference time, or discriminating a voltage amplitude if the checked time duration is longer than the pre-set reference time.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

As an embodiment of a device for detecting a zero crossing and a voltage amplitude of a commercial power source voltage inputted to an electronic device, a device for detecting a zero crossing and a voltage amplitude of a commercial power source voltage inputted to products including an instantaneous water heating module such as a water purifier or a bidet will now be described.

Figure 3:
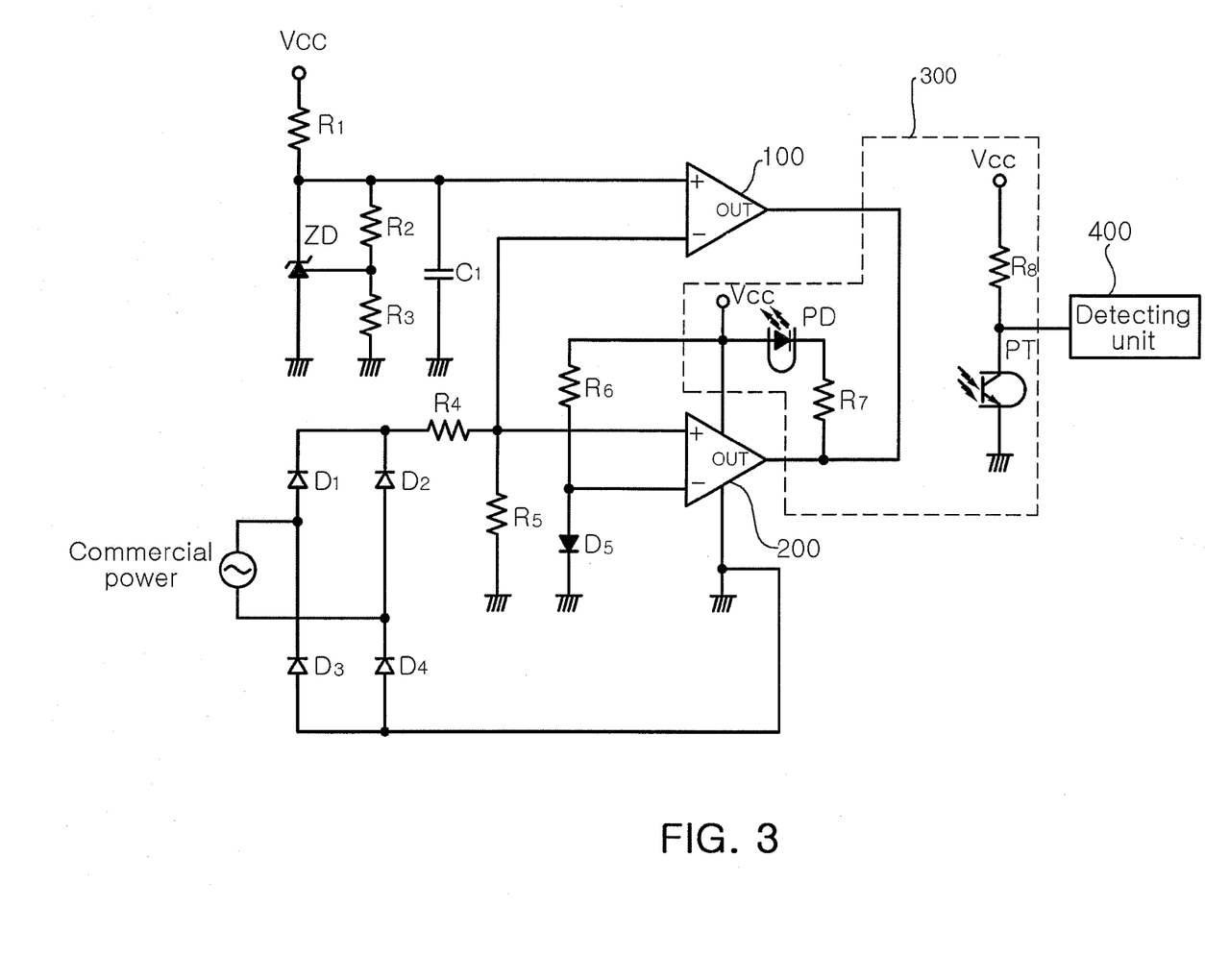
FIG. 3 illustrates the configuration of a device for detecting a zero crossing and a voltage amplitude from a single pulse signal according to an exemplary embodiment of the present invention.

FIG. 3 illustrates the configuration of a device for detecting a zero crossing and a voltage amplitude from a single pulse signal according to an exemplary embodiment of the present invention. As shown in FIG. 3, the device for detecting a zero crossing and a voltage amplitude of a commercial power source voltage inputted to products including an instantaneous water heating module such as a water purifier or a bidet includes a first calculation unit 100, a second calculation unit 200, a pulse output unit 300, and a detecting unit 400.

The device receives an AC commercial power source voltage, performs full wave rectification on the received AC commercial power source voltage via a full wave rectifying circuit including four diodes $D_1$, $D_2$, $D_3$, and $D_4$. The full wave-rectified voltage is input to a negative (−) input terminal of the first calculation unit 100 and a positive (+) input terminal of the second calculation unit 200 via a resistor $R_4$. Both the negative (−) input terminal of the first calculation unit 100 and the positive (+) input terminal of the second calculation unit 200 are grounded via a resistor $R_5$. The resistors R4 and R5 serve to distribute the full wave-rectified voltage to determine the width of an outputted pulse.

When a voltage is supplied to VCC via a power supply device such as a switch mode power supply (SMPS) according to the input of the commercial power source voltage, current flows to a Zener diode (ZD) via a resistor $R_1$. Current rapidly flows to the Zener diode when voltage applied in a reverse direction is higher than a breakdown voltage, and according to this characteristics, the Zener diode is maintained with a constant voltage. The constant voltage due to the Zener diode ZD is inputted to the positive (+) input terminal of the first calculation unit, to become a first reference voltage. The Zener diode ZD, serially connected resistors $R_2$ and $R_3$, and a capacitor $C_1$ are connected to the resistor $R_1$ and grounded.

Because of the voltage supplied to $V_{CC}$, current flows via a resistor $R_6$ and a diode $D_5$. The voltage applied to the diode D5 is inputted as a second reference voltage to a negative (−) input terminal of the second calculation unit. Because the diode $D_5$ is grounded, the second reference voltage is a forward voltage of the diode $D_5$.

According to the inputs of the commercial power source voltage and the first and second reference voltages, calculations are performed by the first and second calculation units 100 and 200 as follows.

The first calculation unit 100 compares the commercial power source voltage to the first reference voltage to determine whether or not the commercial power source voltage is smaller than the first reference voltage, and the second calculation unit 200 compares the commercial power source voltage to the second reference voltage smaller than the first reference voltage to determine whether or not the commercial power source voltage is larger than the second reference voltage.

If the commercial power source voltage is smaller than the first reference voltage but larger than the second reference voltage, the pulse output unit 300 outputs a pulse. The pulse output unit 300, which includes a photo diode (PD) and a photo transistor (PT), is operated if all the calculation conditions performed by the first and second calculation units 100 and 200 are met. Namely, if all the calculation conditions performed by the first and second calculation units 100 and 200 are met, current flows through the PD and a resistor R7. When the PD is operated, the PT is also operated, and according to the voltage supplied to VCC, current flows through a resistor $R_8$ and the PT and the detecting unit 400 detects a pulse voltage applied to the PT.

The detecting unit 400 analyzes the pulse which has been outputted from the pulse output unit 300 to detect a zero crossing and the voltage amplitude. A relevant detailed configuration will be described with reference to FIG. 4.

Figure 4:
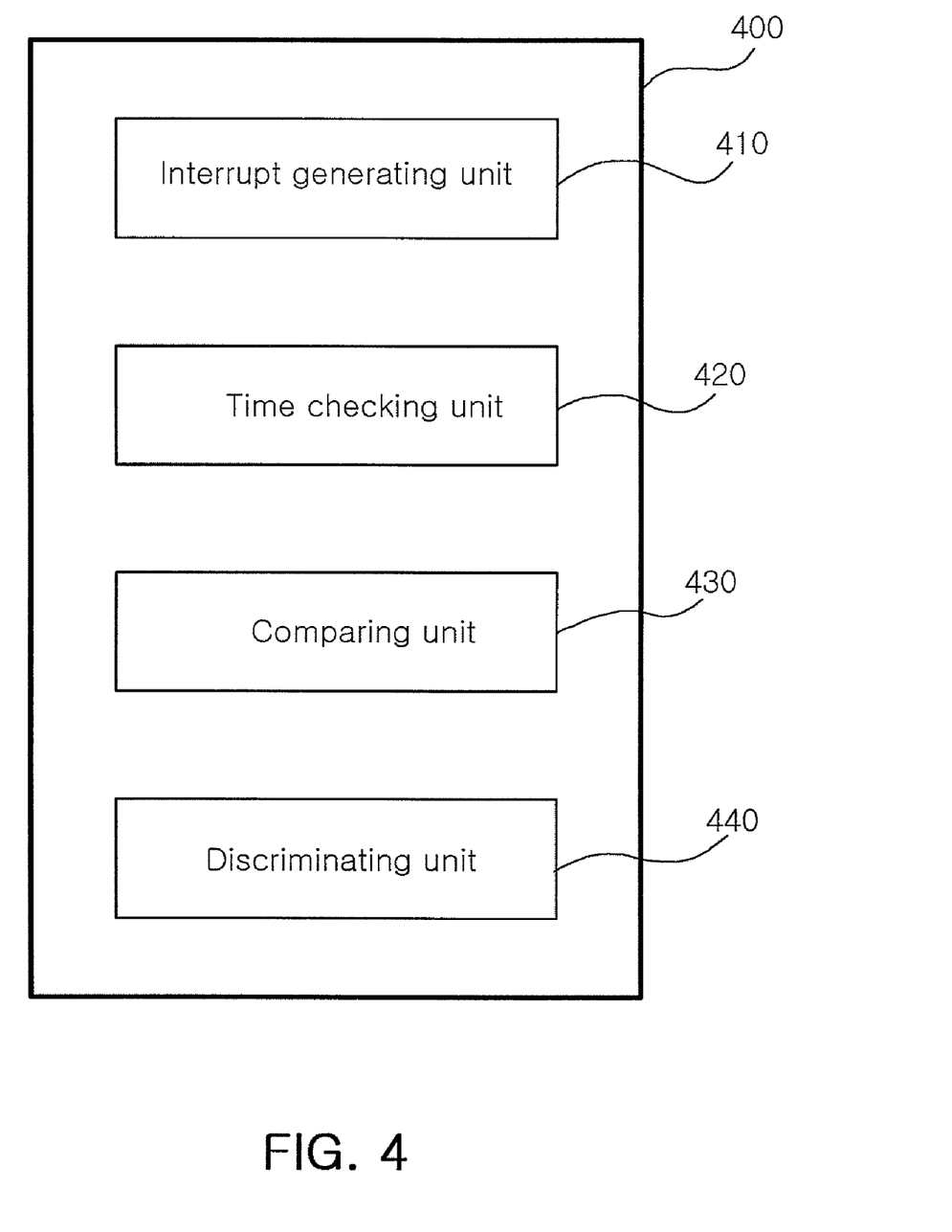
FIG. 4 illustrates the configuration of a detecting unit of FIG. 3.

FIG. 4 illustrates the configuration of the detecting unit of FIG. 3. With reference to FIG. 4, the detecting unit 400 includes an interrupt generating unit 410, a time checking unit 420, a comparing unit 430, and a discriminating unit 440.

The interrupt generating unit 410 generates an interrupt when the pulse which has been outputted by the pulse output unit 300 dies.

The time checking unit 420 checks a time duration from when the pulse which has been outputted from the pulse output unit 300 dies to when the pulse output unit 300 outputs a first different pulse afterward. The time checking unit 420 may be configured as a timer.

The comparing unit 430 compares the time duration checked by the time checking unit 420 to a pre-set reference time.

If the time duration checked by the time checking unit 420 is shorter than the pre-set reference time, the discriminating unit 440 discriminates that there is a zero crossing within the time duration which has been checked by the time checking unit 420. If the time duration checked by the time checking unit 420 is longer than the pre-set reference time, the discriminating unit 440 discriminates the voltage amplitude. When the time checking unit 420 discriminates that there is a zero crossing, the zero crossing is discriminated to exist at a middle point in the time width which has been checked by the time checking unit 420.

Figure 5:
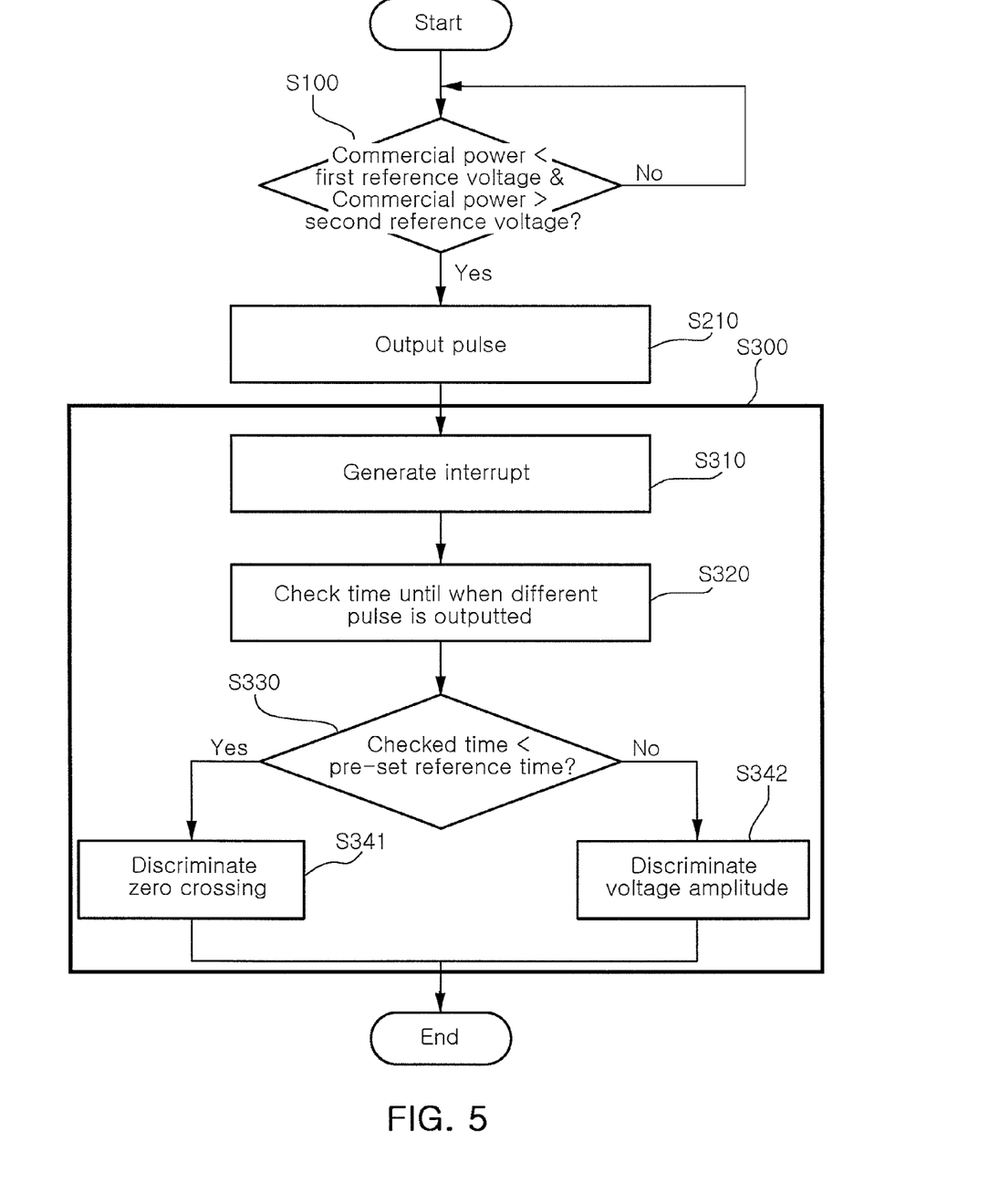
FIG. 5 is a flow chart illustrating a method for detecting a zero crossing and a voltage amplitude from a single pulse signal according to an exemplary embodiment of the present invention.

FIG. 5 is a flow chart illustrating a method for detecting a zero crossing and a voltage amplitude from a single pulse signal according to an exemplary embodiment of the present invention. A method for detecting a zero crossing and a voltage amplitude of a commercial power source voltage inputted to products including an instantaneous water heating module such as a water purifier or a bidet from a single pulse signal will now be described with reference to FIG. 5.

First, the first calculation unit 100 compares the commercial power source voltage to the first reference voltage to determine whether or not the commercial power source voltage is smaller than the first reference voltage. The second calculation unit 200 compares the commercial power source voltage to the second reference voltage to determine whether or not the commercial power source voltage is larger than the second reference voltage. At this time, the pulse output unit 300 determines whether or not the commercial power source voltage is smaller than the first reference voltage but larger than the second reference voltage (S100).

Thereafter, when the calculation conditions performed by the first and second calculation units 100 and 200 are all met, the pulse output unit 300 outputs a pulse (S200). If, however, the conditions are not all met, the calculations results are determined continuously until when the conditions are all met.

And then, the detecting unit 400 analyzes the pulse which has been outputted from the pulse output unit 300 to detect a zero crossing and a voltage amplitude (S300). Step S300 includes substeps S310 to S342. Step S300 will now be described in detail.

First, when the pulse which has been outputted from the pulse output unit 300 dies, the interrupt generating unit 410 generates an interrupt S310.

Next, the time checking unit 420 checks a time duration from when the pulse which has been outputted from the pulse output unit 300 dies to when the pulse output unit 300 outputs a first different pulse (S320).

And then, the comparing unit 430 compares the time duration checked by the time checking unit 420 to the pre-set reference time to determine whether or not the time duration checked by the time checking unit 420 is shorter than the pre-set reference time (S330).

Thereafter, if the time duration checked by the time checking unit 420 is shorter than the pre-set reference time, the discriminating unit 440 discriminates that there is a zero crossing within the time duration as checked by the time checking unit 420 (S341). Meanwhile, if the time duration checked by the time checking unit 420 is longer than the pre-set reference time, the discriminating unit 440 discriminates the voltage amplitude (S342).

Figure 6A:
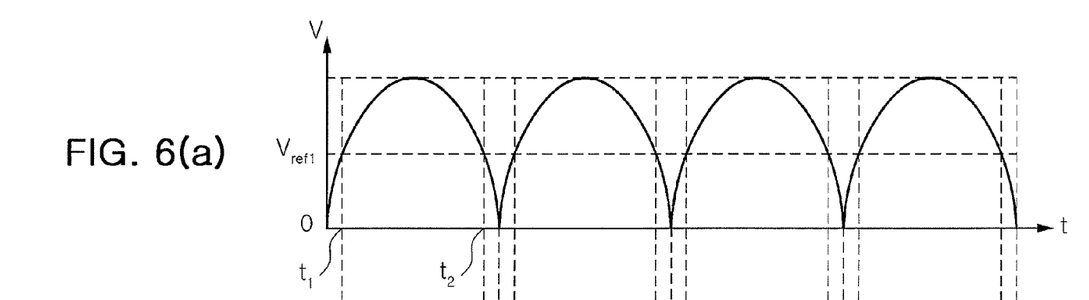
FIGS. 6(a) to 6(c) are graphs showing how the zero crossing and voltage amplitude are detected from a single pulse signal.
Figure 6B:
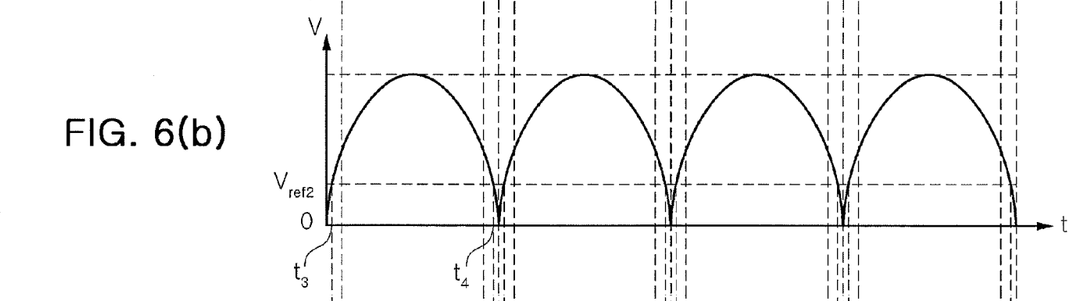
Figure 6C:
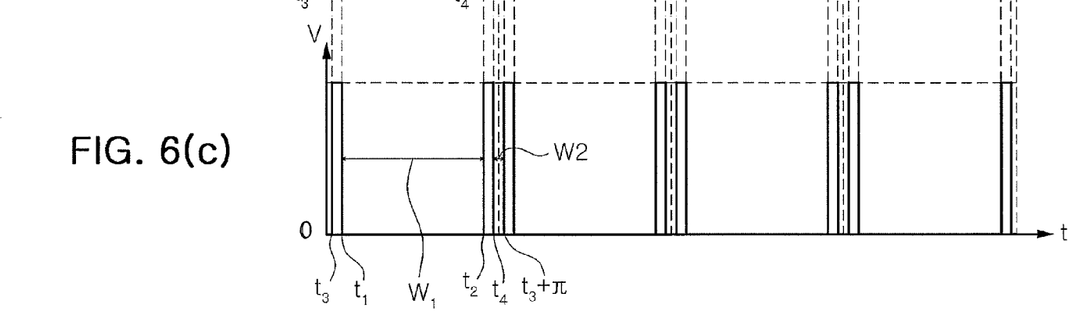

FIGS. 6(a) to 6(c) are graphs showing how the zero crossing and voltage amplitude are detected from a single pulse signal. With reference to FIGS. 3 and 6, FIG. 6(a) is a graph of a waveform of the voltage supplied as commercial power over the first reference voltage ($V_{ref1}$), FIG. 6(b) is a graph of the waveform of the voltage supplied as the commercial power over the second reference voltage ($V_{ref2}$), and FIG. 6(c) is a graph of a waveform of the pulse which has been outputted to the pulse output unit 300.

The full-wave rectified waveforms as shown in FIGS. 6(a) and 6(b) are waveforms which are inputted to the first and second calculation units 100 and 200 via the resistor $R_4$ after being full-wave rectified via the diodes $D_1$, $D_2$, $D_3$, and $D_4$. The first and second reference voltages are applied to the capacitor $C_1$ and the diode $D_5$, respectively. The waveform of the pulse which has been outputted from the pulse output unit 300 as shown in FIG. 6(c) is outputted when the full-wave rectified voltage as shown in FIGS. 6(a) and 6(b) is lower than the first reference voltage but higher than the second reference voltage.

The time widths (W1 and W2) from which the output pulse as shown in FIG. 6(c) dies to when a different pulse is outputted afterward are obtained through the following process. Here, as the period of the full-wave rectified waveform of the commercial power source voltage, π sec will be taken as an example for the sake of brevity.

First, in order to obtain time at which the full-wave rectified waveform value of FIG. 6(a) and the first reference voltage are the same, Equation 1 shown below may be induced (in this case, w=2πf.

$$V_{ref1} = \frac{R_5}{R_4} V_{max} \sin wt \quad \text{[Equation 1]}$$

The reason for multiplying $$\frac{R_5}{R_4}$$

at the right side of Equation 1 is because the full-wave rectified voltage is distributed by the resistors R4 and R5 via the diodes $D_1$, $D_2$, $D_3$, and $D_4$.

Equation 1 may be arranged to be indicated as 't' represented by Equation 2 shown below:

$$t = \arcsin \frac{\frac{R_4}{R_5} \frac{V_{ref1}}{V_{max}}}{2\pi f} \quad \text{[Equation 2]}$$

It is assumed that the commercial power source voltage and the first reference voltage as shown in FIG. 6(a) are 220V and 5V, respectively, and the resistors R4 and R5 are 100 kΩ and 2.2 kΩ, respectively. In this case, a maximum value of V ($V_{max}$) is $\sqrt{2}$ times the 220V, which is around 311V, and the frequency 'f' is considered 60 Hz.

When the above values are substituted to Equation 2, $t_1=0.00217$, and because $t_2=\pi-t_1$, $t_2=0.00616$.

Thereafter, $t_3$ and $t_4$ in FIG. 6(b) can be obtained in the same manner, and W1 and W2 may be obtained from $t_1$, $t_2$, $t_3$, and $t_4$. Here, $W_1=t_2-t_1$, and $W_2=\pi+t_3-t_4$.

If the obtained time widths W1 and W2 are longer than the pre-set reference time, it is discriminated that there is a zero crossing, while if the obtained time widths W1 and W2 are shorter than the pre-set reference time, the voltage amplitude is discriminated. In this case, it is discriminated such that the zero crossing is at a middle point of W2, and the voltage amplitude is discriminated by reversely tracking the process of obtaining $t_1$ and $t_2$. Namely, the inputted voltage amplitude may be discriminated by obtaining the time when the pulse which has been outputted by the pulse output unit 300 dies and the time when the pulse output unit 300 outputs a first different pulse afterward.

Because the same pulse is repeatedly generated at the position of the same waveform and both W1 and W2 are generated during a single pulse generation period (πsec), W1 is longer than $$\frac{\pi}{2}$$

sec and shorter than πsec and W2 is shorter than $$\frac{\pi}{2}$$

sec. Thus, preferably, the pre-set reference time is set as $$\frac{\pi}{2}$$

sec, which corresponds to the half period of the waveform obtained by performing full-wave rectification on the commercial power source voltage.

As set forth above, according to exemplary embodiments of the invention, the zero crossing and voltage amplitude of the commercial power source voltage inputted to an electronic device are detected from a single pulse signal. Thus, the number of components used for products can be reduced, which leads to a reduction in the production unit cost. Thus, the product supply costs can be reduced and the spending appetite of consumers wanting low-cost products can be satisfied.

While the present invention has been shown and described in connection with the exemplary embodiments, it will be apparent to those skilled in the art that modifications and variations can be made without departing from the spirit and scope of the invention as defined by the appended claims.

What is claimed is:

1. An apparatus for detecting a zero crossing and a voltage amplitude of a commercial power source voltage inputted to an electronic device, the apparatus comprising:

a first calculation unit that compares the commercial power source voltage to a first reference voltage to determine whether or not the commercial power source voltage is smaller than the first reference voltage;

a second calculation unit that compares the commercial power source voltage to a second reference voltage smaller than the first reference voltage to determine whether or not the commercial power source voltage is larger than the second reference voltage;

a pulse output unit that outputs a pulse if the commercial power source voltage is smaller than the first reference voltage but larger than the second reference voltage; and a detecting unit that detects a zero crossing and a voltage amplitude by analyzing the pulse which has been outputted from the pulse output unit.

2. The apparatus of claim 1, wherein the detecting unit comprises:

an interrupt generating unit that generates an interrupt when the pulse which has been outputted by the pulse output unit dies;

a time checking unit that checks a time duration from when the pulse which has been outputted by the pulse output unit dies to when the pulse output unit outputs a first different pulse afterward;

a comparing unit that compares the time duration checked by the time checking unit to a pre-set reference time; and a discriminating unit that discriminates that there is a zero crossing within the time duration checked by the time checking unit if the time duration checked by the time checking unit is shorter than the pre-set reference time, or discriminates a voltage amplitude if the time duration checked by the time checking unit is longer than the pre-set reference time.

3. The apparatus of claim 2, wherein the discriminating unit discriminates such that the zero crossing exists at a middle point of the time width checked by the time checking unit.

4. The apparatus of claim 2, wherein the discriminating unit discriminates the input voltage amplitude by obtaining a time point at which the pulse which has been outputted by the pulse output unit dies and a time point at which the pulse output unit outputs the first different pulse afterward.

5. The apparatus of claim 2, wherein the pre-set reference time corresponds to a half period of a waveform obtained by performing full wave rectification on the commercial power source voltage.

6. A method for detecting a zero crossing and a voltage amplitude of a commercial power source voltage inputted to an electronic device, the method comprising:

comparing the commercial power source voltage to a first reference voltage to determine whether or not the commercial power source voltage is smaller than the first reference voltage;

comparing the commercial power source voltage to a second reference voltage smaller than the first reference voltage to determine whether or not the commercial power source voltage is larger than the second reference voltage;

outputting a pulse if the commercial power source voltage is smaller than the first reference voltage but larger than the second reference voltage; and detecting a zero crossing and a voltage amplitude by analyzing the outputted pulse.

7. The method of claim 6, wherein the detecting of a zero crossing and a voltage amplitude comprises:
generating an interrupt when the outputted pulse dies;
checking a time duration from when the outputted pulse dies to when a first different pulse is outputted afterward;
comparing the checked time duration to a pre-set reference time; and
discriminating that there is a zero crossing within the checked time duration if the checked time duration is shorter than the pre-set reference time, or discriminating a voltage amplitude if the checked time duration is longer than the pre-set reference time.

* * * * *

UNITED STATES PATENT AND TRADEMARK OFFICE
CERTIFICATE OF CORRECTION

| | |
|---|---|
| PATENT NO. | : 8,058,852 B2 |
| APPLICATION NO. | : 12/428420 |
| DATED | : November 15, 2011 |
| INVENTOR(S) | : Tae Kyung Kang et al. |

It is certified that error appears in the above-identified patent and that said Letters Patent is hereby corrected as shown below:

IN THE SPECIFICATION:

In column 6, Line 43: Replace "$w=2\pi\int$."

with -- $w=2\pi f$. --

Signed and Sealed this
Eighth Day of May, 2012

David J. Kappos
*Director of the United States Patent and Trademark Office*